(12) United States Patent
Albsmeier et al.

(10) Patent No.: US 9,804,238 B2
(45) Date of Patent: Oct. 31, 2017

(54) LOCAL COIL SYSTEM INCLUDING AN ENERGY RECEPTION ANTENNA FOR INDUCTIVELY RECEIVING ENERGY FOR THE LOCAL COIL SYSTEM

(71) Applicants: Andre Albsmeier, München (DE); Franz Eiermann, Rattelsdorf-Ebing (DE); Klaus Huber, Effeltrich (DE); Dominikus Joachim Müller, München (DE)

(72) Inventors: Andre Albsmeier, München (DE); Franz Eiermann, Rattelsdorf-Ebing (DE); Klaus Huber, Effeltrich (DE); Dominikus Joachim Müller, München (DE)

(73) Assignee: Siemens Aktiengesellschaft, München (DE)

( * ) Notice: Subject to any disclaimer, the term of this patent is extended or adjusted under 35 U.S.C. 154(b) by 721 days.

(21) Appl. No.: 14/227,999

(22) Filed: Mar. 27, 2014

(65) Prior Publication Data

US 2014/0292339 A1 Oct. 2, 2014

(30) Foreign Application Priority Data

Mar. 27, 2013 (DE) .................. 10 2013 205 464

(51) Int. Cl.
*G01R 33/36* (2006.01)
*G01R 33/3415* (2006.01)

(52) U.S. Cl.
CPC ...... *G01R 33/3621* (2013.01); *G01R 33/3415* (2013.01)

(58) Field of Classification Search
CPC .................. G01R 33/3621; G01R 33/3415
See application file for complete search history.

(56) References Cited

U.S. PATENT DOCUMENTS 6,023,166 A * 2/2000 Eydelman ........ G01R 33/34053
324/318
6,747,452 B1 * 6/2004 Jectic ................. G01R 33/3657
324/311

(Continued)

FOREIGN PATENT DOCUMENTS

DE 102010044187 A1 5/2012
DE 102011076918 A1 12/2012

OTHER PUBLICATIONS

German Search Report dated Oct. 16, 2013 for corresponding German Patent No. DE 10 2013 205 464.5 with English translation.

*Primary Examiner* — G. M. Hyder
(74) *Attorney, Agent, or Firm* — Lempia Summerfield Katz LLC

(57) ABSTRACT

A local coil system for detecting magnetic resonance (MR) signals in a magnetic resonance tomography (MRT) device includes an energy reception antenna for inductively receiving energy for the local coil system from a magnetic field changing over time with an energy transmission frequency. The energy reception antenna includes a conductor loop running in loop-like fashion from a first loop connection to a second loop connection. At least one path filter that blocks for harmonic frequencies of the energy transmission frequency is arranged over the course of the energy reception path, and/or at least one path filter that blocks for harmonic frequencies of the energy transmission frequency is arranged over the course of an energy reception path leading from the loop connections to a rectifier.

14 Claims, 4 Drawing Sheets

(56) References Cited

U.S. PATENT DOCUMENTS

2006/0226841 A1 10/2006 Boskamp et al.
2012/0299593 A1 11/2012 Biber
2012/0313645 A1 12/2012 Biber et al.

* cited by examiner

LOCAL COIL SYSTEM INCLUDING AN ENERGY RECEPTION ANTENNA FOR INDUCTIVELY RECEIVING ENERGY FOR THE LOCAL COIL SYSTEM

This application claims the benefit of DE 10 2013 205 464.5, filed on Mar. 27, 2013, which is hereby incorporated by reference in its entirety.

BACKGROUND

The present embodiments relate to a local coil system for detecting magnetic resonance (MR) signals in a magnetic resonance tomography (MRT) device.

Such a local coil system is known, for example, from DE 10 2011 076 918 A1.

In the known local coil system, the energy reception antenna is tuned or tunable to the energy transmission frequency, for example, via the conductor loop used for forming the energy reception antenna being connected in a suitable manner for this, including the arrangement provided in some exemplary embodiments of a capacitor along the conductor loop.

Although resonant and therefore very efficient withdrawal of energy from the magnetic field provided for energy transmission is achieved with this measure in the known local coil system, the basic problem remains whereby a greater or lesser influencing or disruption of the detection of MR signals likewise performed by means of so-called local coils of the local coil system can be brought about as a result of the energy transmission.

Although an MR frequency of the MR signals to be detected, which correspond to the nuclear spin responses (e.g., of the order of magnitude of 100 MHz or more), and the energy transmission frequency (e.g., of the order of magnitude of a few MHz), may be far removed from one another, that both the MR signal reception and energy reception both take place inductively, in physical proximity (e.g., within the local coil system), and also the further-processing of the MR signals and the energy takes place within the same system, are to be considered.

The mechanisms that may result in the detected MR signals being impaired or distorted owing to the additional energy reception are diverse (as explained further below).

SUMMARY AND DESCRIPTION

The scope of the present invention is defined solely by the appended claims and is not affected to any degree by the statements within this summary.

The present embodiments may obviate one or more of the drawbacks or limitations in the related art. For example, a local coil system developed such that influences on magnetic resonance (MR) signal detection owing to additional energy reception are reduced is provided.

A filter with a determined filter characteristic is arranged at least one suitable point in the local coil system such that, while utilizing the diversity of the energy transmission frequency and the MR frequency, the mentioned influences are avoided particularly effectively.

In accordance with a first aspect, at least one filter, referred to below as "conductor loop filter", that blocks for an MR frequency of the MR signals to be detected is arranged over the course of the conductor loop.

Via this measure, the energy reception antenna is made to a certain extent "blind" to the MR signals to be detected, with the result that, advantageously, a withdrawal of energy from the "field of the MR signals" is suppressed, and thus, influencing of the MR signal detection by the energy reception antenna is reduced.

At the same time, influencing of the field of the MR excitation signals is advantageously also reduced since these signals used for exciting the nuclear spin have the same frequency (e.g., "MRT system frequency") as the MR signals to be detected, corresponding to the nuclear spin responses.

The MRT system frequency is dependent, as is known, on the nature of the MRT method (e.g., hydrogen MRT) and the magnitude of the homogeneous steady-state "main magnetic field" used in the MRT, corresponding to the Larmor frequency of the relevant nuclear spins.

With respect to the spatial resolution of the MR signal detection that is generally implemented in MRT examinations by generating magnetic field gradients, the MR frequency is fixedly predetermined for individual MRT experiments, but varies slightly in the context of the overall examination. To this extent, the term "MR frequency" denotes any frequency in a corresponding narrow MR frequency band of the MRT device in question.

The width of the MR frequency band may be a factor of approximately $10^2$ smaller than the mid-frequency of this band, however. In the case of hydrogen MRT with a magnitude of 3 T for the main magnetic field, a Larmor frequency results and therefore an MRT system frequency of approximately 123 MHz results. The width of the MR frequency band results from the gradient-related discrepancies in the magnetic field in the examination room and may be a few MHz (e.g., 1 to 4 MHz).

In one embodiment, the local coil system is designed to detect MR signals of an MR frequency in the region of at least 50 MHz (e.g., at least 100 MHz). In one embodiment, the MR frequency may be less than 600 MHz.

In one embodiment, the conductor loop of the energy reception antenna frames an arrangement of one or more MR reception antennas of the local coil system. The arrangement is provided for receiving MR signals. A particularly compact design of the local coil system with high energy withdrawal efficiency may thus advantageously be realized.

The MR reception antenna arrangement framed by the energy reception antenna may have, for example, at least four MR reception antennas (e.g., at least six MR reception antennas). The individual MR reception antennas may, for example, be in the form of conductor loops and may be arranged next to one another (e.g., partially overlapping one another in a common local coil area (flat or curved)). The conductor loop of the energy reception antenna acting as a frame may be in the same area or plane, for example.

The at least one conductor loop filter that is arranged over the course of the conductor loop and blocks for the MR frequency may be a passive filter.

In one embodiment, the conductor loop filter has a bandstop characteristic that is suitable for blocking the MR frequency. The MR frequency may be in the range of from 100 to 600 MHz. The bandwidth of the mentioned bandstop characteristic may be, for example, less than 20% (e.g., less than 10% of the MR frequency).

In another embodiment, the conductor loop filter has a bandpass characteristic that is suitable for allowing the passage of the energy transmission frequency. The energy transmission frequency may be in the range of from 1 to 10 MHz. The bandwidth of the mentioned bandpass characteristic may be, for example, less than 20% (e.g., less than 10% of the energy transmission frequency).

In one embodiment, a plurality of conductor loop filters are arranged over the course of the conductor loop (e.g., with a maximum mutual spacing of in each case at most a quarter-wavelength corresponding to the MR frequency). Thus, wave propagation on the conductor loop at the MR frequency may be suppressed particularly effectively.

In accordance with a second aspect, which may advantageously also be combined with the first aspect, in the case of a local coil system, an energy reception path that leads from the conductor loop connections of the energy reception antenna to a rectifier of the local coil system in that at least one filter, referred to below as "path filter", which blocks for harmonic frequencies of the energy transmission frequency, is arranged over the course of the energy reception path.

By virtue of this measure, the formation and/or propagation of such harmonic frequencies in the energy reception path is reduced, which has an advantageous effect for reducing influencing of the MR signal detection owing to the additional energy reception in so far as these harmonic frequencies (e.g., harmonics of the energy transmission frequency) may also have components at the MR frequency or in the vicinity thereof. The formation and propagation of the latter frequency components may therefore result in disadvantageous influencing of the MR signal detection.

Via this measure, for example, a situation in which harmonics generated in the region of the rectifier (which is more or less unavoidable in practice) run along the energy reception path in the reverse direction back towards the energy reception antenna and cause currents flowing through the conductor loop there that are at or close to the MR frequency. The latter case would necessarily result in more or less considerable distortion of the MR signal measurement as a result of the MR local coil arrangement provided for this.

In one embodiment, the path filter has a low-pass characteristic (e.g., with a limit frequency that is greater than the energy transmission frequency and is less than twice or less than 1.5 times the energy transmission frequency).

For example, when the limit frequency is intended to be selected to be just above the energy transmission frequency, a low-pass filter of a higher order (e.g., at least a third-order low-pass filter) may advantageously be used.

In one embodiment, the path filter is arranged directly upstream of the rectifier over the course of the energy transmission path.

In one embodiment, an impedance conversion is provided over the course of the energy transmission path. The impedance conversion may represent, for example, a first section of the energy transmission path (e.g., connected directly to the conductor loop connections) Impedance conversion may advantageously be implemented with a corresponding matching network including capacitances and/or inductances such that the withdrawal of energy from the alternating magnetic field that results using the conductor loop therefore takes place in a targeted manner with non-optimal efficiency, but, for example, only less than 80% (e.g., less than 50% is withdrawn of the energy that would result in the case of optimum impedance matching of the energy reception path taking into consideration the impedance of the energy reception antenna). Such knowingly "weak coupling" of the energy reception antenna is, for example, advantageous in so far as a plurality of energy reception antennas of the local coil system may each draw energy from the transmission field to a more equivalent extent in order to be able to supply, for example, different parts of the local coil system in each case separately with energy.

In accordance with one embodiment, the local coil system includes a plurality of energy reception antennas that may be connected, for example, respectively to a dedicated energy transmission path. Parts further downstream in the energy transmission course (e.g., rectifier) may also be implemented by a commonly used part of the local coil system. Each of such a plurality of energy reception antennas may frame in each case an arrangement of one or more MR reception antennas, for example.

A low-losses implementation of the matching network for impedance conversion may be provided, for example, using capacitors. In one embodiment, at least one capacitor in the input-side current flow path is arranged at the input of the matching network.

Such a capacitor in the matching network, alternatively or additionally also at another point on the energy reception path, advantageously effects blocking of DC components that would otherwise be extremely disadvantageous in the region of the conductor loop since an additional magnetic field distorting the main magnetic field or the superimposed gradient magnetic fields would thus be generated (e.g., by a DC component flowing via the conductor loop). In practice, such DC components on the conductor loop that generate DC magnetic fields in the $\mu T$ range significantly impair the MRT spatial resolution.

Correspondingly, the energy reception path may be configured such that with respect to a current flowing through the conductor loop of the energy reception antenna during energy reception, blocking of the DC component is provided.

As already explained, the arrangement of a path filter over the course of the energy reception path is advantageous for harmonic separation. With respect to a reduction, which is likewise advantageous in this context, of the generation of harmonics, in one embodiment, the rectifier is configured such that a current flows at a rectifier input for both half-cycles. In contrast to this, for example, a rectifier formed merely from a (single) diode would be unfavorable owing to the thus increased generation of harmonics. Therefore, rectifier circuits including a plurality of diodes (e.g., with nonlinearities that are reduced as much as possible) may therefore be provided. Within this aspect, for example, the use of Schottky diodes may be advantageous.

For example, the rectifier may be implemented as a diode rectifier in a Villard or Greinacher circuit, with the result that a lower degree of harmonics generation and a voltage multiplication (e.g., voltage doubling) is realized. In addition, a relatively large diode reverse voltage is advantageously avoided with such circuits.

An energy storage element (e.g., capacitor) may be provided at the output of the rectifier in order to smooth the output voltage of the rectifier and to store the received energy for the electrical supply to relevant electronic circuit parts of the local coil system.

In one embodiment, the local coil system is configured not only for the wireless reception of the supply energy for the local coil electronics, but also for wireless back-transmission of the detected MR signals (e.g., by radio), possibly after conditioning (e.g., preamplification, analog-to-digital conversion, etc.) by parts of the local coil system provided for this purpose. Thus, advantageously, a wireless local coil system may be provided (e.g., in which both the energy and the signal or data transmission between the local coil system and an MRT device base or the MRT evaluation unit functions without wiring).

DETAILED DESCRIPTION

Figure 1:
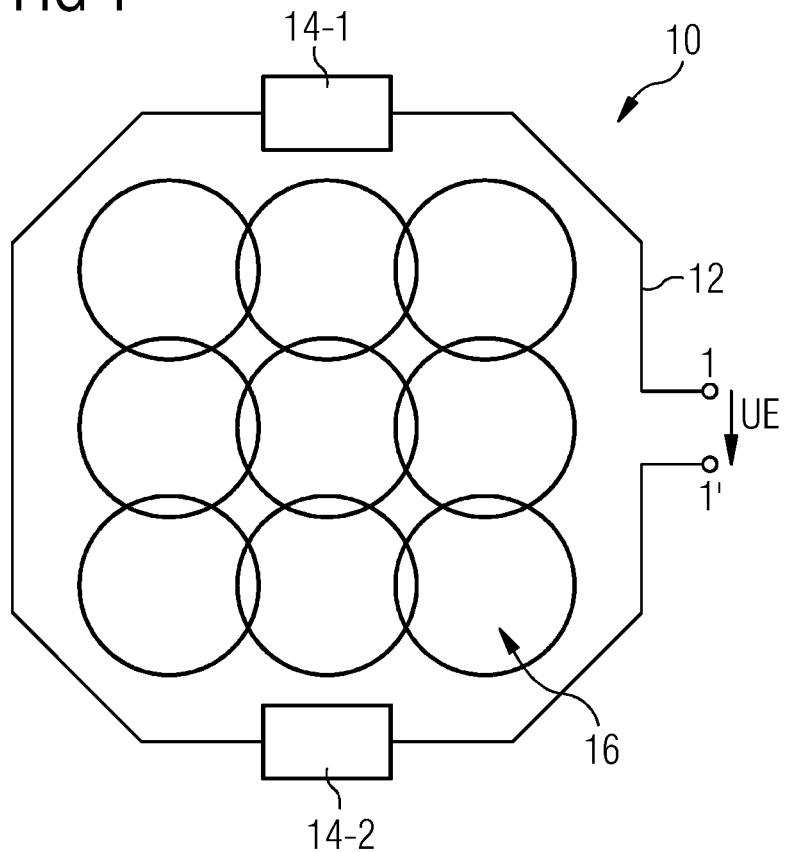
FIG. 1 shows a schematic illustration of one embodiment of a local coil arrangement of a local coil system, and a conductor loop of an energy reception antenna of the local coil system.

FIG. 1 illustrates one embodiment of an energy reception antenna 10 for use in a local coil system (not illustrated as a whole) for detecting MR signals in an MRT device. The energy reception antenna 10 serves to inductively receive energy for local electronics of the local coil system from a magnetic field changing over time with an energy transmission frequency. The energy reception antenna 10 includes a conductor loop 12 that runs in the form of a loop from a first loop connection 1 to a second loop connection 1'.

The magnetic field changing over time (e.g., rotating field rotating with the energy transmission frequency) induces an AC voltage UE provided at the loop connections 1, 1'. Using the AC voltage, after rectification, an energy store (capacitor) of the local coil system may be charged or recharged. This rectification and energy storage will be described in more detail further below with reference to FIG. 3.

FIG. 1 illustrates the conductor loop 12 with only one turn. The profile of the conductor loop 12 may also form a plurality of turns.

A plurality of filters (e.g., two filters 14-1 and 14-2), referred to below as conductor loop filters, are arranged over the course of the conductor loop 12. The plurality of filters each block for the MR frequency (e.g., 123 MHz +/−1 MHz) of the MR signals to be picked up by a local coil arrangement 16 (e.g., corresponding to the nuclear spin responses).

This advantageously suppresses energy withdrawal by the energy reception antenna 10 from the magnetic field that changes over time with the MR frequency of the excited nuclear spins. The magnetic field is to be detected by the local coil arrangement 16 provided for this purpose in the form of the MR signals.

Correspondingly, influencing of the MR signal detection performed by the arrangement 16 owing to the additional energy reception performed by the energy reception antenna 10 is reduced.

In the example illustrated, the conductor loop 12 frames the local coil arrangement 16. The local coil arrangement is formed from a flat arrangement of 9 partially overlapping local coils ("loops"), in the example illustrated. The tap of the MR signals at the individual local coils of the local coil arrangement 16 is not illustrated in FIG. 1, for reasons of simplicity.

In the example illustrated, the conductor loops of the local coil arrangement 16 and the conductor loop 12 of the energy reception antenna 10 are in a common plane, with the result that the arrangement shown in FIG. 1 may easily be accommodated in a flat "local coil mat" or the like. In a manner known, such a local coil mat may be curved, with the result that, correspondingly, the arrangement illustrated in FIG. 1 may likewise overall have such a curvature.

In one embodiment, the framed local coil arrangement has, as does, for example, the local coil arrangement 16 illustrated, a polygonal contour (e.g., rectangular or square). The conductor loop, following this contour, likewise has a polygonal profile (e.g., octagonal).

The profile of the conductor loop 12 may have a length (e.g., >1 m) that is often greater than a wavelength corresponding to the MR frequency (e.g., the wave propagation at the MR frequency on the conductor loop 12). For example, a plurality of conductor loop filters, such as the filters 14-1, 14-2 illustrated, may be arranged distributed over the length of the conductor loop 12. For example, all of the conductor sections between these filters or between the loop connections 1, 1' and the respectively adjacent one of the filters correspond to a quarter-wavelength.

Figure 2:
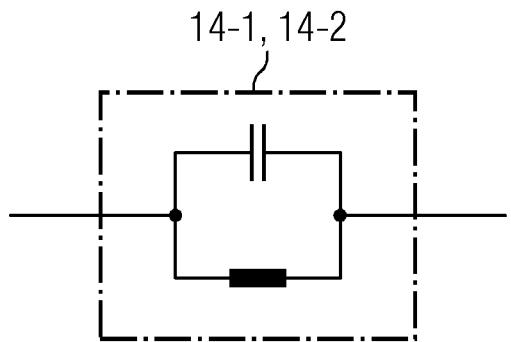
FIG. 2 shows an example of a configuration of a conductor loop filter that may be used for the energy reception antenna shown in FIG. 1.

FIG. 2 shows a simple and particularly effective configuration of the conductor loop filters 14-1, 14-2, in the exemplary embodiment illustrated. There is a parallel circuit of a capacitance and an inductance that forms a bandstop configured such that the MR frequency (e.g., of the order of magnitude of approximately 100 MHz) is blocked.

As an alternative to a bandstop, at a deviation from the example illustrated, for example, a conductor loop filter with a bandpass characteristic may also be used, with the energy transmission frequency (e.g., of the order of magnitude of a few MHz) being in the passband thereof.

Figure 3:
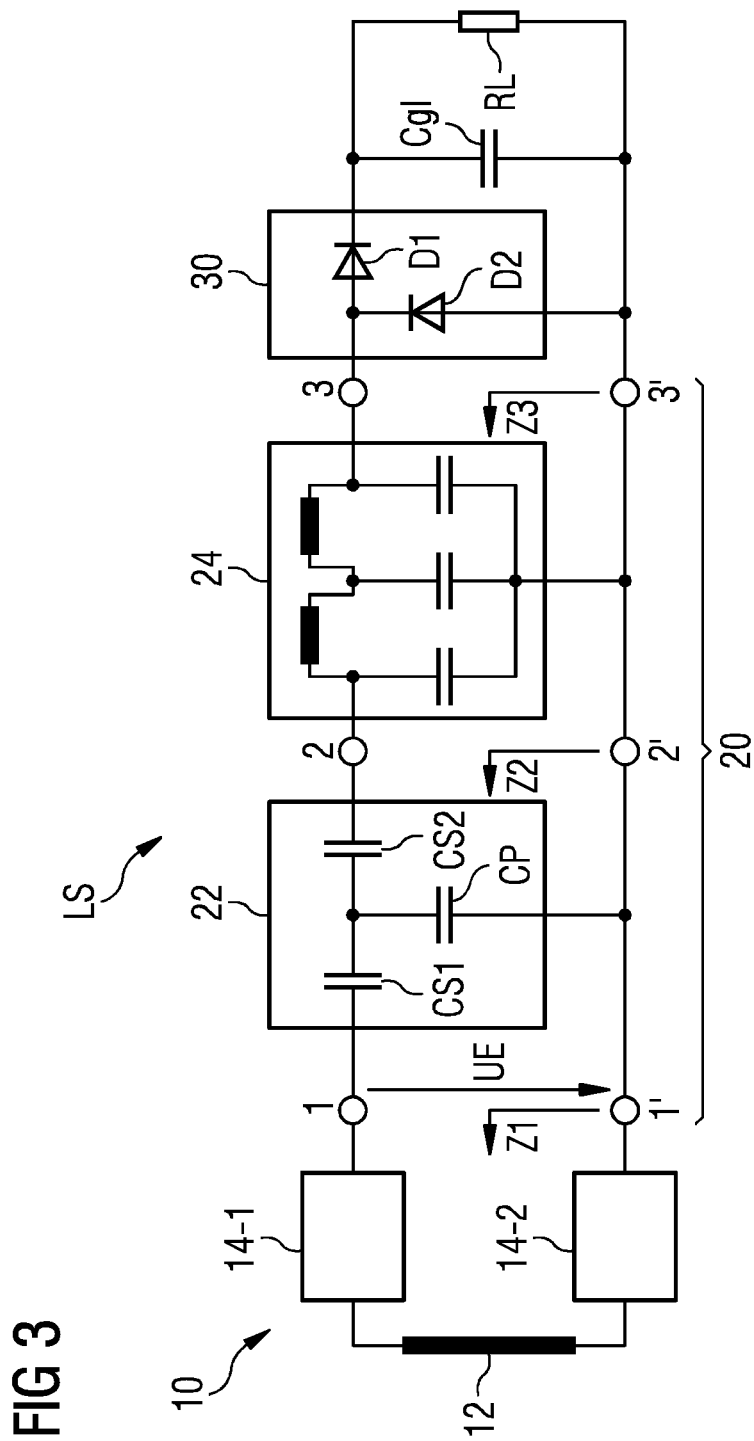
FIG. 3 shows an exemplary embodiment of the components of a local coil system for energy reception.

FIG. 3 illustrates, for greater understanding of the present embodiments, components of a local coil system LS using a block circuit diagram illustrating an energy reception chain, via which the supply energy is received and passed on up to an energy store (e.g., capacitor).

The left-hand part of the figure illustrates an energy reception antenna 10 configured as described with reference to FIGS. 1 and 2, for example, again including a conductor loop 12 with conductor loop filters 14-1, 14-2 arranged over the course of the conductor loop between conductor loop connections 1, 1'. An impedance Z1 results at the output of the energy reception antenna 10.

The local coil system LS also includes an energy reception path 20 that is connected on the input side to the conductor loop connections 1, 1' and leads on the output side, via connections 3, 3', to a rectifier 30 of the local coil system LS.

A smoothing and storage capacitor Cgl to be charged with the received energy is arranged at the output of the rectifier 30, with local coil electronics being supplied from the smoothing and storage capacitor. The local coil electronics are symbolized by a load resistor RL in FIG. 3.

The energy reception path 20 in the example illustrated is formed from a matching network 22 and a filter network, referred to below as path filter 24.

The conductor loop filter 14-1, 14-2 arranged over the course of the conductor loop 12 prevent, to a relatively large degree, energy being removed from the MR signal field (and/or MR excitation field) by the energy reception antenna 10. Such a withdrawal of energy takes place unimpeded, however, at the energy transmission frequency of the magnetic field provided for energy transmission.

The matching network 22 in the example illustrated is arranged so as to directly follow the energy reception antenna 10 along the energy reception path 20 and serves the purpose of converting the output impedance Z1 inherent to the energy reception antenna 10 to give a desired impedance Z2 (e.g., taking into consideration the rectifier properties). The desired impedance Z2 is then present at the output of the matching network 22 (e.g., connections 2, 2'). In the case of the impedance conversion of Z1 to give Z2 thus realized, in the example illustrated, consideration should further be given to the fact that the impedance Z2 is converted to give an impedance Z3 (e.g., at the connections 3, 3') by the downstream filter network 24.

The matching network 22 is formed with particularly low losses from the capacitors CS1, CP and CS2 with the circuitry illustrated (e.g., the capacitors CS1 and CS2 form impedances integrated in the current flow path in series on the input side or on the output side, whereas the capacitor CP represents an impedance which connects the two path lines and is connected to a node between the capacitors CS1, CS2).

The matching network 22 or the impedances used for this (e.g., the capacitors CS1, CS2 and CP) are, in accordance with a more specific configuration variant, configured for an impedance conversion (e.g., from Z1 to Z2) that does not result in optimum energy withdrawal from the energy transmission magnetic field, but provides a certain "mismatching" or relatively weak coupling of the antenna 10 to the transmission path 20.

This may be very advantageous, for example, for implementing simultaneous and uniform energy supply given the presence of a plurality of further energy reception antennas (not illustrated in the figures).

These further energy reception antennas that may be provided may be configured as has already been described for the antenna 10 and may be used for separately supplying energy to other parts of the local electronics.

For example, a plurality of energy reception antennas of the local coil system may each be used for separate supply of electrical energy to multiply provided parts of the local electronics (e.g., preamplifiers, analog-to-digital converters, modulators, etc.) that are each assigned to that MR local coil arrangement in the vicinity of which the respective energy reception antenna is arranged (e.g., is framed by the respective energy reception antenna).

In the example illustrated, the matching network 22, owing to the use of the capacitors CS1 and CS2 integrated in series, also has a further advantageous functionality that includes providing blocking of the DC component with respect to a current flowing through the conductor loop 12 during energy reception.

If such a DC component blocking is not already realized by a suitable configuration of the conductor loop filter(s), this may advantageously be provided, for example, by the matching network 22 of the type illustrated. The DC component suppression advantageously avoids the generation of an extremely disadvantageous DC magnetic field in the system environment of interest, for example, through the conductor loop 12. Such a DC magnetic field may disadvantageously impair, for example, the spatial resolution provided in the MRT examination using the gradient fields. In the energy reception path 20 illustrated, for example, the capacitor CS1 already effects such decoupling of DC voltage components in order to thus prevent retrospective interaction with the MR imaging.

The path filter 24 arranged downstream of the matching network 22 in the example illustrated is used for blocking harmonic frequencies of the energy transmission frequency. In the example illustrated, this is in the form of a fifth-order low-pass filter in order to achieve a particularly steep edge of the low-pass characteristic at a specific limit frequency, which may be selected to be just, in relative terms (e.g., less than 5%), above the energy transmission frequency to which passage is allowed (e.g., 5 MHz), for example.

With the path filter 24, it is advantageously possible for harmonics resulting during the rectification by the rectifier 30 to be impeded when returning to the energy reception antenna 10, with the result that emission of magnetic fields at the frequencies of the harmonics is thus advantageously avoided, which would be damaging for the MR signal reception.

As a deviation from the exemplary embodiment illustrated, the matching network 22 for impedance conversion (and possibly, as implemented here, for DC component separation) and the path filter 24 in the form of a filter network for harmonic separation may also form one unit, in terms of circuitry.

The rectifier 30 forming the termination of the energy transmission path 20 serves the purpose of making the energy received at the energy transmission frequency usable by virtue of rectification for charging and recharging the smoothing and storage capacitor Cgl.

In one embodiment, a rectifier circuit, as is also illustrated in FIG. 3, in which a current flows at a rectifier input (e.g., connections 3, 3') for both half-cycles of the supplied AC signal, is provided. In the case of the rectifier 30 illustrated, this is implemented by the use of two Schottky diodes D1 and D2, which are arranged in a so-called Villard or Greinacher circuit in order to charge the storage capacitor Cgl with voltage doubling.

In addition, with the Villard or Greinacher circuit illustrated, the application of a relatively high voltage to a diode in the reverse direction of the diode in question is avoided, which likewise represents a considerable advantage (but may also be realized by other rectifier circuits than the specific Villard or Greinacher circuit illustrated).

In the rectifier circuit shown in FIG. 3, by charging the capacitor CS2 integrated in this case in the matching network 22 via the diode D2 in one half-cycle and the capacitor Cgl via the diode D1 in the other half-cycle, the rectifier voltage is virtually doubled, and the reverse voltage at the diode D1 is limited.

Instead of the diode D2, an inductance (e.g., inductor) may also be used. Should very low rectifier voltages be required, the diode losses (e.g., brought about by the forward voltage of D2) may be higher than if an inductor is used instead of the diode D2. During the time period in which the diode D1 is off, however, there is a much higher reverse voltage at the diode, which may result in rapid degradation or destruction of the diode. For this reason, as a deviation from the example shown in FIG. 3, a symmetric embodiment of the energy reception path 20 (cf., the exemplary embodiments shown in FIGS. 4 and 5) may be selected even if the number of components required for this is greater in comparison with the circuit shown in FIG. 3.

The example shown in FIG. 3 has the advantage in terms of circuitry that the circuit blocks matching network 22, path filter 24 and rectifier 30 form an asymmetric or "single-ended" arrangement and therefore require fewer components than in the case of a symmetrical design.

In each case, symmetrical configurations will be described below with reference to FIGS. 4 and 5.

Figure 4:
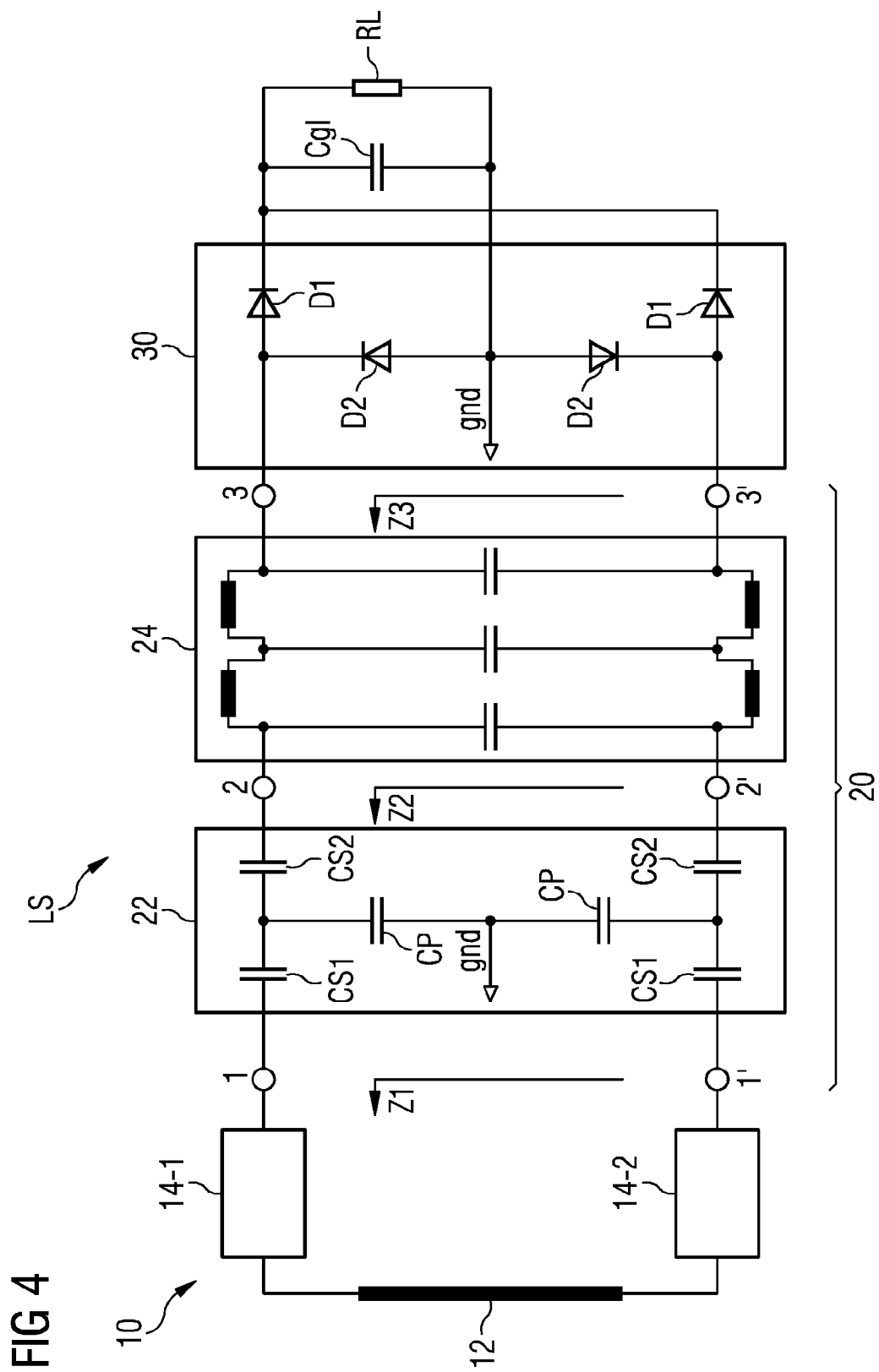
FIG. 4 shows one embodiment of a local coil system.
Figure 5:
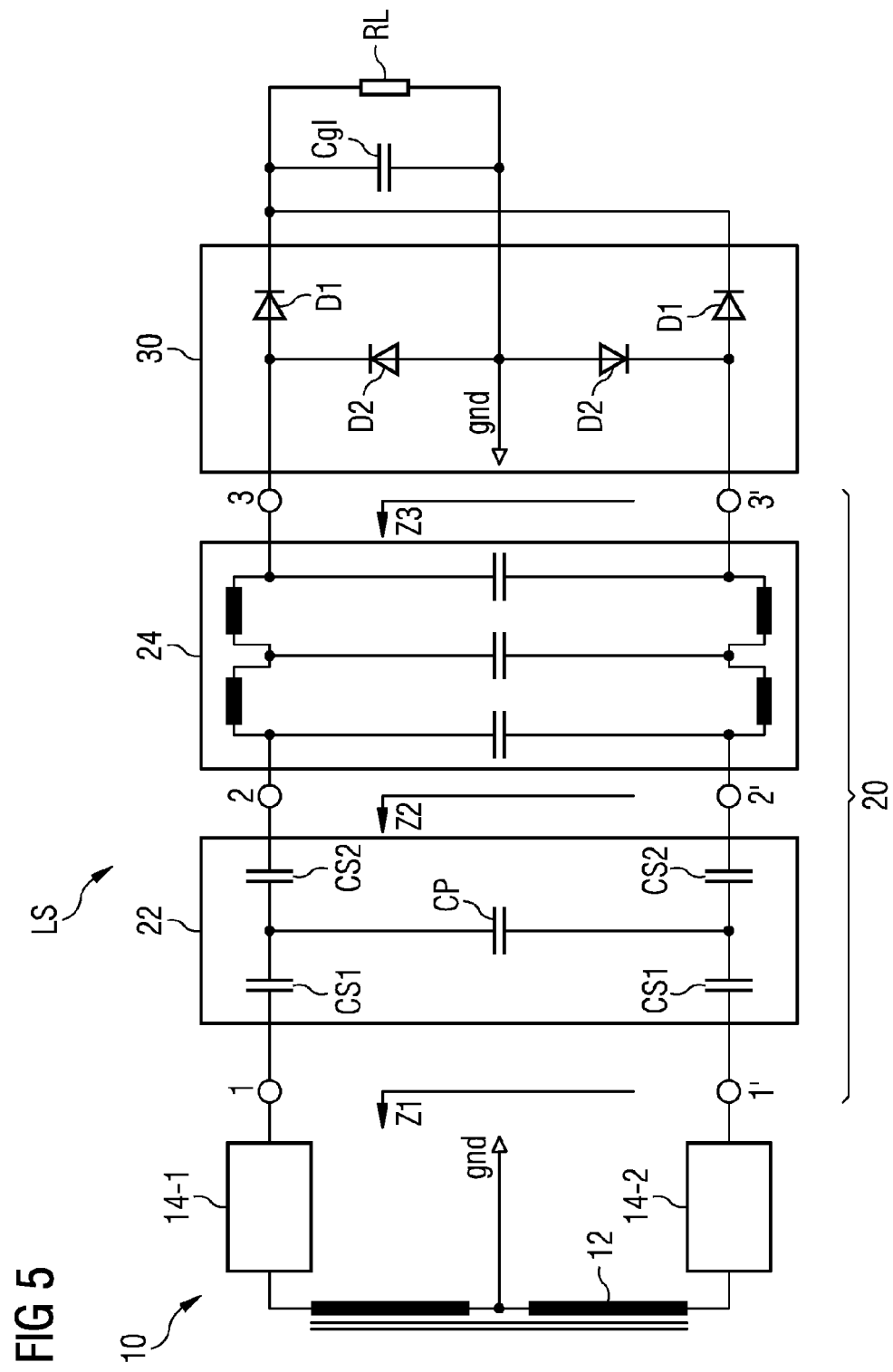
FIG. 5 shows another embodiment of a local coil system.

In the examples shown in FIGS. 4 and 5, in each case, the same reference symbols are used for functionally identical components. With respect to the way in which these examples function, whereby these examples differ substantially only in terms of their symmetrized design, reference is made to the preceding description.

In the example shown in FIG. 4, as illustrated, a symmetrical energy reception antenna 10 and a symmetrizing energy reception path 20 are provided.

In contrast, in the example shown in FIG. 5, as illustrated, a symmetrizing energy reception antenna 10 with a symmetrical energy reception path 20 is provided.

In both embodiments, the filtering and rectification have a symmetrical form. The diodes D2 used in the respective rectifiers 30 may also be replaced by inductances (e.g., inductors).

By way of summary, advantageously, a high degree of interference suppression with respect to the MR signal detection may be achieved with the local coil system according to one or more of the present embodiments, and the circuit arrangements explained by way of example here for forming an energy reception chain from the energy reception antenna to the energy storage capacitor. With the described configurations of the components of the energy reception path, a high degree of flexibility with respect to the voltage or current ranges desired on the output side and a high degree of efficiency of the energy transmission (e.g., with low losses) are enabled.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A local coil system for detecting magnetic resonance (MR) signals in a magnetic resonance tomography (MRT) device, the local coil system comprising:
   an energy reception antenna operable for inductively receiving energy for the local coil system from a magnetic field changing over time with an energy transmission frequency,
   wherein the energy reception antenna comprises a conductor loop running in loop-like fashion from a first loop connection to a second loop connection,
   wherein at least one conductor loop filter that blocks a MR frequency of the MR signals to be detected is arranged over a course of the conductor loop,
   wherein the at least one conductor loop filter comprises a plurality of conductor loop filters arranged over the course of the conductor loop with a maximum mutual spacing of a quarter-wavelength corresponding to the MR frequency.

2. The local coil system of claim 1, wherein the conductor loop of the energy reception antenna frames an arrangement of one or more MR reception antennas of the local coil system, the arrangement being operable for receiving the MR signals.

3. The local coil system of claim 2, wherein the at least one conductor loop filter has a bandpass characteristic operable for allowing passage of the energy transmission frequency.

4. The local coil system of claim 1, wherein the at least one conductor loop filter has a bandpass characteristic operable for allowing passage of the energy transmission frequency.

5. The local coil system of claim 1, further comprising:
   an energy reception path that leads from conductor loop connectors of the energy reception antenna to a rectifier of the local coil system; and
   at least one path filter arranged over a course of the energy reception path, the at least one path filter being operable to block harmonic frequencies of the energy transmission frequency.

6. The local coil system of claim 5, wherein the at least one path filter has a low-pass characteristic.

7. The local coil system of claim 6, further comprising a matching network configured for impedance conversion provided over the course of the energy reception path.

8. The local coil system of claim 7, wherein the energy reception path is configured such that, with respect to a current flowing through the conductor loop of the energy reception antenna during energy reception, blocking of a DC component is provided.

9. The local coil system of claim 7, wherein the rectifier is configured such that a current flows at a rectifier input for both half-cycles.

10. The local coil system of claim 6, wherein the rectifier is configured such that a current flows at a rectifier input for both half-cycles.

11. The local coil system of claim 5, wherein the energy reception path is configured such that, with respect to a current flowing through the conductor loop of the energy reception antenna during energy reception, blocking of a DC component is provided.

12. The local coil system of claim 11, wherein the rectifier is configured such that a current flows at a rectifier input for both half-cycles.

13. The local coil system of claim 5, wherein the rectifier is configured such that a current flows at a rectifier input for both half-cycles.

14. The local coil system of claim 6, wherein the energy reception path is configured such that, with respect to a current flowing through the conductor loop of the energy reception antenna during energy reception, blocking of a DC component is provided.

* * * * *